United States Patent [19]

Jacobs

[11] 4,028,539
[45] June 7, 1977

[54] MEMORY WITH ERROR DETECTION AND CORRECTION MEANS

[75] Inventor: Pieter Anton Jacobs, Apeldoorn, Netherlands

[73] Assignee: U.S. Philips Corporation, New York, N.Y.

[22] Filed: Nov. 20, 1975

[21] Appl. No.: 633,575

[30] Foreign Application Priority Data

Dec. 9, 1974 Netherlands ...................... 7415966

[52] U.S. Cl. ......................................... 235/153 AM
[51] Int. Cl.[2] .................. G06F 11/00; G11C 29/00
[58] Field of Search ......... 235/153 AM; 340/172.5, 340/174 ED; 445/1

[56] References Cited

UNITED STATES PATENTS

| | | | |
|---|---|---|---|
| 3,781,826 | 12/1973 | Beausoleil | 340/172.5 |
| 3,796,996 | 3/1974 | Curley et al. | 340/172.5 |
| 3,803,560 | 4/1974 | DeVoy et al. | 340/172.5 |
| 3,872,291 | 3/1975 | Hunter, II | 235/153 AM |
| 3,917,933 | 11/1975 | Scheuneman et al. | 235/153 AM |

*Primary Examiner*—Charles E. Atkinson
*Attorney, Agent, or Firm*—Frank R. Trifari; Daniel R. McGlynn

[57] ABSTRACT

The invention relates to a memory device which initially consists of a number of modules which can be exchanged and wherein no non-correctable storage errors are present. If such errors occur at a later stage, the address of the detective module is applied to an inversion device which is connected between an address input line and the actual memory device. This address actuates the inversion device such that the relevant memory unit becomes the last one in the sequence of memory units. By blocking the highest address, a memory device having a substantially unchanged capacity can thus be automatically realized. By replacement of the defective module at a later stage, the original capacity can be restored. If a second module fails after the first module has become defective, the sequence can be modified again etc., with the result that each time an as large as possible number of modules of the memory device can be addressed in a consecutive sequence.

2 Claims, 6 Drawing Figures

| | | | | | | | | | | | | | | | | | | | |
|---|---|---|---|---|---|---|---|---|---|---|---|---|---|---|---|---|---|---|---|
| 0 | 0 | 0 | 0 | 0 | 15 | 14 | 13 | 12 | 11 | 10 | 9 | 8 | 7 | 6 | 5 | 4 | 3 | 2 | 1 | 0 |
| 1 | 0 | 0 | 0 | 1 | 14 | 15 | 12 | 13 | 10 | 11 | 8 | 9 | 6 | 7 | 4 | 5 | 2 | 3 | 0 | 1 |
| 2 | 0 | 0 | 1 | 0 | 13 | 12 | 15 | 14 | 9 | 8 | 11 | 10 | 5 | 4 | 7 | 6 | 1 | 0 | 3 | 2 |
| 3 | 0 | 0 | 1 | 1 | 12 | 13 | 14 | 15 | 8 | 9 | 10 | 11 | 4 | 5 | 6 | 7 | 0 | 1 | 2 | 3 |
| 4 | 0 | 1 | 0 | 0 | 11 | 10 | 9 | 8 | 15 | 14 | 13 | 12 | 3 | 2 | 1 | 0 | 7 | 6 | 5 | 4 |
| 5 | 0 | 1 | 0 | 1 | 10 | 11 | 8 | 9 | 14 | 15 | 12 | 13 | 2 | 3 | 0 | 1 | 6 | 7 | 4 | 5 |
| 6 | 0 | 1 | 1 | 0 | 9 | 8 | 11 | 10 | 13 | 12 | 15 | 14 | 1 | 0 | 3 | 2 | 5 | 4 | 7 | 6 |
| 7 | 0 | 1 | 1 | 1 | 8 | 9 | 10 | 11 | 12 | 13 | 14 | 15 | 0 | 1 | 2 | 3 | 4 | 5 | 6 | 7 |
| 8 | 1 | 0 | 0 | 0 | 7 | 6 | 5 | 4 | 3 | 2 | 1 | 0 | 15 | 14 | 13 | 12 | 11 | 10 | 9 | 8 |
| 9 | 1 | 0 | 0 | 1 | 6 | 7 | 4 | 5 | 2 | 3 | 0 | 1 | 14 | 15 | 12 | 13 | 10 | 11 | 8 | 9 |
| 10 | 1 | 0 | 1 | 0 | 5 | 4 | 7 | 6 | 1 | 0 | 3 | 2 | 13 | 12 | 15 | 14 | 9 | 8 | 11 | 10 |
| 11 | 1 | 0 | 1 | 1 | 4 | 5 | 6 | 7 | 0 | 1 | 2 | 3 | 12 | 13 | 14 | 15 | 8 | 9 | 10 | 11 |
| 12 | 1 | 1 | 0 | 0 | 3 | 2 | 1 | 0 | 7 | 6 | 5 | 4 | 11 | 10 | 9 | 8 | 15 | 14 | 13 | 12 |
| 13 | 1 | 1 | 0 | 1 | 2 | 3 | 0 | 1 | 6 | 7 | 4 | 5 | 10 | 11 | 8 | 9 | 14 | 15 | 12 | 13 |
| 14 | 1 | 1 | 1 | 0 | 1 | 0 | 3 | 2 | 5 | 4 | 7 | 6 | 9 | 8 | 11 | 10 | 13 | 12 | 15 | 14 |
| 15 | 1 | 1 | 1 | 1 | 0 | 1 | 2 | 3 | 4 | 5 | 6 | 7 | 8 | 9 | 10 | 11 | 12 | 13 | 14 | 15 |

Fig.1

| | | | | | | | | |
|---|---|---|---|---|---|---|---|---|
| 0 1 | 0 0 0 0 | 0 0 0 1 | 14 | 2 5 | 0 0 0 1 | 0 1 1 0 | 11 |
| 0 2 | 0 0 0 0 | 0 0 1 0 | 13 | 2 6 | 0 0 1 0 | 0 1 1 0 | 11 |
| 0 3 | 0 0 1 0 | 0 0 0 1 | 13 | 2 7 | 0 0 1 1 | 0 1 1 0 | 11 |
| 0 4 | 0 0 0 0 | 0 1 0 0 | 11 | 2 8 | 0 0 0 0 | 1 0 1 0 | 7 |
| 0 5 | 0 0 0 1 | 0 1 0 0 | 11 | 2 9 | 0 0 0 1 | 1 0 1 0 | 7 |
| 0 6 | 0 0 1 0 | 0 1 0 0 | 11 | 2 10 | 0 0 1 0 | 1 0 1 0 | 7 |
| 0 7 | 0 0 1 1 | 0 1 0 0 | 11 | 2 11 | 0 0 1 1 | 1 0 1 0 | 7 |
| 0 8 | 0 0 0 0 | 1 0 0 0 | 7 | 2 12 | 0 1 0 0 | 1 0 1 0 | 7 |
| 0 9 | 0 0 0 1 | 1 0 0 0 | 7 | 2 13 | 0 1 0 1 | 1 0 1 0 | 7 |
| 0 10 | 0 0 1 0 | 1 0 0 0 | 7 | 2 14 | 0 1 1 0 | 1 0 1 0 | 7 |
| 0 11 | 0 0 1 1 | 1 0 0 0 | 7 | 2 15 | 0 1 1 1 | 1 0 1 0 | 7 |
| 0 12 | 0 1 0 0 | 1 0 0 0 | 7 | 3 4 | 0 0 0 0 | 0 1 1 1 | 11 |
| 0 13 | 0 1 0 1 | 1 0 0 0 | 7 | 3 5 | 0 0 0 1 | 0 1 1 1 | 11 |
| 0 14 | 0 1 1 0 | 1 0 0 0 | 7 | 3 6 | 0 0 1 0 | 0 1 1 1 | 11 |
| 0 15 | 0 1 1 1 | 1 0 0 0 | 7 | 3 7 | 0 0 1 1 | 0 1 1 1 | 11 |
| 1 2 | 0 0 0 0 | 0 0 1 1 | 13 | 3 8 | 0 0 0 0 | 1 0 1 1 | 7 |
| 1 3 | 0 0 0 1 | 0 0 1 1 | 13 | 3 9 | 0 0 0 1 | 1 0 1 1 | 7 |
| 1 4 | 0 0 0 0 | 0 1 0 1 | 11 | 3 10 | 0 0 1 0 | 1 0 1 1 | 7 |
| 1 5 | 0 0 0 1 | 0 1 0 1 | 11 | 3 11 | 0 0 1 1 | 1 0 1 1 | 7 |
| 1 6 | 0 0 1 0 | 0 1 0 1 | 11 | 3 12 | 0 1 0 0 | 1 0 1 1 | 7 |
| 1 7 | 0 0 1 1 | 0 1 0 1 | 11 | 3 13 | 0 1 0 1 | 1 0 1 1 | 7 |
| 1 8 | 0 0 0 0 | 1 0 0 1 | 7 | 3 14 | 0 1 1 0 | 1 0 1 1 | 7 |
| 1 9 | 0 0 0 1 | 1 0 0 1 | 7 | 3 15 | 0 1 1 1 | 1 0 1 1 | 7 |
| 1 10 | 0 0 1 0 | 1 0 0 1 | 7 | 4 5 | 0 1 0 0 | 0 1 0 1 | 14 |
| 1 11 | 0 0 1 1 | 1 0 0 1 | 7 | 4 6 | 0 1 0 0 | 0 1 1 0 | 13 |
| 1 12 | 0 1 0 0 | 1 0 0 1 | 7 | 4 7 | 0 1 0 1 | 0 1 1 0 | 13 |
| 1 13 | 0 1 0 1 | 1 0 0 1 | 7 | 4 8 | 0 0 0 0 | 1 1 0 0 | 7 |
| 1 14 | 0 1 1 0 | 1 0 0 1 | 7 | 4 9 | 0 0 0 1 | 1 1 0 0 | 7 |
| 1 15 | 0 1 1 1 | 1 0 0 1 | 7 | 4 10 | 0 0 1 0 | 1 1 0 0 | 7 |
| 2 3 | 0 0 1 0 | 0 0 1 1 | 14 | 4 11 | 0 0 1 1 | 1 1 0 0 | 7 |
| 2 4 | 0 0 0 0 | 0 1 1 0 | 11 | 4 12 | 0 1 0 0 | 1 1 0 0 | 7 |

Fig. 2a

| | | | | | | | |
|---|---|---|---|---|---|---|---|
| 4 13 | 0 1 0 1 | 1 1 0 0 | 7 | 7 15 | 0 1 1 1 | 1 1 1 1 | 7 |
| 4 14 | 0 1 1 0 | 1 1 0 0 | 7 | 8 9 | 1 0 0 0 | 1 0 0 1 | 14 |
| 4 15 | 0 1 1 1 | 1 1 0 0 | 7 | 8 10 | 1 0 0 0 | 1 0 1 0 | 13 |
| 5 6 | 0 1 0 0 | 0 1 1 1 | 13 | 8 11 | 1 0 0 1 | 1 0 1 0 | 13 |
| 5 7 | 0 1 0 1 | 0 1 1 1 | 13 | 8 12 | 1 0 0 0 | 1 1 0 0 | 11 |
| 5 8 | 0 0 0 0 | 1 1 0 1 | 7 | 8 13 | 1 0 0 1 | 1 1 0 0 | 11 |
| 5 9 | 0 0 0 1 | 1 1 0 1 | 7 | 8 14 | 1 0 1 0 | 1 1 0 0 | 11 |
| 5 10 | 0 0 1 0 | 1 1 0 1 | 7 | 8 15 | 1 0 1 1 | 1 1 0 0 | 11 |
| 5 11 | 0 0 1 1 | 1 1 0 1 | 7 | 9 10 | 1 0 0 0 | 1 0 1 1 | 13 |
| 5 12 | 0 1 0 0 | 1 1 0 1 | 7 | 9 11 | 1 0 0 1 | 1 0 1 1 | 13 |
| 5 13 | 0 1 0 1 | 1 1 0 1 | 7 | 9 12 | 1 0 0 0 | 1 1 0 1 | 11 |
| 5 14 | 0 1 1 0 | 1 1 0 1 | 7 | 9 13 | 1 0 0 1 | 1 1 0 1 | 11 |
| 5 15 | 0 1 1 1 | 1 1 0 1 | 7 | 9 14 | 1 0 1 0 | 1 1 0 1 | 11 |
| 6 7 | 0 1 1 0 | 0 1 1 1 | 14 | 9 15 | 1 0 1 1 | 1 1 0 1 | 11 |
| 6 8 | 0 0 0 0 | 1 1 1 0 | 7 | 10 11 | 1 0 0 0 | 1 0 0 1 | 14 |
| 6 9 | 0 0 0 1 | 1 1 1 0 | 7 | 10 12 | 1 0 0 0 | 1 1 1 0 | 11 |
| 6 10 | 0 0 1 0 | 1 1 1 0 | 7 | 10 13 | 1 0 0 1 | 1 1 1 0 | 11 |
| 6 11 | 0 0 1 1 | 1 1 1 0 | 7 | 10 14 | 1 0 1 0 | 1 1 1 0 | 11 |
| 6 12 | 0 1 0 0 | 1 1 1 0 | 7 | 10 15 | 1 0 1 1 | 1 1 1 0 | 11 |
| 6 13 | 0 1 0 1 | 1 1 1 0 | 7 | 11 12 | 1 0 0 0 | 1 1 1 1 | 11 |
| 6 14 | 0 1 1 0 | 1 1 1 0 | 7 | 11 13 | 1 0 0 1 | 1 1 1 1 | 11 |
| 6 15 | 0 1 1 1 | 1 1 1 0 | 7 | 11 14 | 1 0 1 0 | 1 1 1 1 | 11 |
| 7 8 | 0 0 0 0 | 1 1 1 1 | 7 | 11 15 | 1 0 1 1 | 1 1 1 1 | 11 |
| 7 9 | 0 0 0 1 | 1 1 1 1 | 7 | 12 13 | 1 1 0 0 | 1 1 0 1 | 14 |
| 7 10 | 0 0 1 0 | 1 1 1 1 | 7 | 12 14 | 1 1 0 0 | 1 1 1 0 | 13 |
| 7 11 | 0 0 1 1 | 1 1 1 1 | 7 | 12 15 | 1 1 0 1 | 1 1 1 0 | 13 |
| 7 12 | 0 1 0 0 | 1 1 1 1 | 7 | 13 14 | 1 1 0 0 | 1 1 1 1 | 13 |
| 7 13 | 0 1 0 1 | 1 1 1 1 | 7 | 13 15 | 1 1 0 1 | 1 1 1 1 | 13 |
| 7 14 | 0 1 1 0 | 1 1 1 1 | 7 | 14 15 | 1 1 1 0 | 1 1 1 1 | 14 |

Fig. 2b

MEMORY WITH ERROR DETECTION AND CORRECTION MEANS

The invention relates to a method of storing binary information elements in a series of a first number of separate, removable memory units of a memory device, each of the memory units having a capacity of a plurality of binary information elements, the memory units being actuatable by read and/or write commmand signals and also being addressable by first binary sub-address signals in accordance with a first sequence from a first to a last memory unit inclusive, binary information elements in a memory unit being addressable by second sub-address signals.

Methods of this kind are widely used. Each of the memory units contains, for example, a number of random access memory words. A variety of storage errors exist. It may occur that the information bits stored are mutilated beyond recognition by reading. It is also possible that an information bit has an incorrect value when read, with the result that, for example, an information word or byte obtains an incorrect parity. It may also occur that given memory positions cannot be addressed or only incorrectly addressed, for example, due to a defect in the drive amplifiers of a module. Given methods are known for detecting and localizing such storage errors. The invention does not relate to such methods *per se*. Furthermore, error correction methods are known whereby, for example, a mutilated information bit in a word can be restored. However, there are also errors which are beyond correction. If a non-correctable error is detected, the memory device can subsequently be de-activated. This is very disadvantageous for the performance of a computer system incorporating the memory device. It is alternatively possible to de-activate the defective memory unit separately and to have a service technician install a substitute, properly operating memory unit. However, this procedure is time-consuming and it is almost certain that the defective memory unit will meanwhile be addressed: memory units of this kind usually form the so-termed main memory of a computer system whose capacity is always chosen to be just sufficient for economic reasons. It is known to memorize for the time being the address of the defective memory unit, together with a substitute address. The addressing of this address reference memory each time requires a substantial amount of time. The invention has for its object to minimize the negative effects of a detected noncorrectable storage error. The invention aims to deactivate the defective memory unit quickly and automatically. The invention aims to keep an as large as possible part of the memory device in operation. This is achieved according to the invention by utilizing a very simple method. The invention renders as many addresses as possible successively accessible on the basis of a basic address, without an address translation device being required which has to be separately addressed. This object is achieved according to the invention in that when a non-correctable storage error is detected in a first defective memory unit, first binary sub-address signals thereof are applied to a storage unit, under the control of an outout signal of the storage unit further first binary sub-address signals being invertable, whereby the memory units can be addressed from a first to an extreme memory unit inclusive, in accordance with a second, changed sequence of a second number of memory units, the second number being smaller than the first number and all memory units having a modified rank within the second number, the first defective memory unit being assigned a lower rank within the sequence than the extreme memory unit and no longer being addressable as such.

The storage unit may be an electronically operating memory. In given cases it may also be advantageously embodied in electrochemical components, for example, the positions of a number of switches; in that case no delay occurs. Because, moreover, only the first binary sub-addresses are modified, fast operation can be achieved; for example, when an entire memory unit is read, inversion of the binary address signals is required only once.

The invention furthermore relates to a memory device for performing the described method. The memory device is composed of a series of a first number of separate, exchangeable memory units which are initially free from non-correctable storage errors and which comprise a first input address line for first binary sub-address signals whereby the memory units can be addressed in accordance with a first sequence from a first to a last memory unit inclusive. Means are provided for applying second binary sub-address signals whereby for each memory unit binary memory elements can be addressed. The invention also includes a control line for read and write command signals, and a detection device. The latter detects a later occurring non-correctable storage error, so that, under the control of an output signal of the detection device, (and additional signals which correspond to last received first binary sub-address signals which localize the non-correctable storage error within a first defective memory), an inversion device is activated.

The inversion device is included between the address line and the memory device and offering permanently modifiable storage of information corresponding to a single set of first binary sub-address signals, so that by the inversion of later received first binary sub-address signals the memory units are subsequently addressable according to a second, modified sequence, blocking means being provided whereby the first defective memory unit at a lower rank than previously within the sequence becomes inaccessible for further addressing.

The inversion elements are thus directly controlled by the output signals of the memory elements, so that no special control by an external control device is required. An inversion element of this kind can be formed by an inverting gate per address line, with the result that the delay of the address signals can be very small.

There are preferably provided an inversion element for all binary address signals which identify the relevant memory units, and also a memory element for the formation corresponding to the address signals of the first memory unit, each inversion element being controlled by an output signal of one of the memory elements which corresponds thereto as regards significance. The defective memory unit thus automatically becomes the last one in the sequence (having the highest address when a start is made from an address (0,0, ... 0), and the remaining modules can remain permanently addressed in accordance with a consecutive sequence.

A binary "0" in the address of the memory unit containing the non-correctable storage error preferably controls the inversion unit of corresponding significance for inversion. This offers a simple realization.

It is advantageous if, under the control of an output signal of the detection device and last received address signals for a second memory unit wherein a non-correctable storage error subsequently occurred, all less significant address signals can be applied from the second memory unit, under the control of the most significantly different binary address signal of the address signals of the first and second memory unit, to the memory elements so as to form output signals thereof which correspond therewith as regards significance.

It is advantageous if, under the control of the most significantly different one of the address signals of the first and second memory unit, a number of memory units which corresponds to the value of the most significant signal plus one is rendered non-addressable as from the end of the second sequence then prevailing. Depending on the combinations of defective memory units, in total only 1, 2, 3, 5, 9, 17 etc. memory units can then no longer be addressed, while the remaining connected units remain addressable, as will be described hereinafter.

It is an advantageous aspect of the invention that the full capacity is regained after repair or replacement of the defective memory units.

The invention will be described in detail hereinafter with reference to the drawing.

FIG. 1 shows a table listing the various possibilities when use is made of a sequence of 16 modules.

FIG. 2, comprised of FIGS. 2a and 2b, shows different possibilities when two non-usable modules are present.

Figure 3:
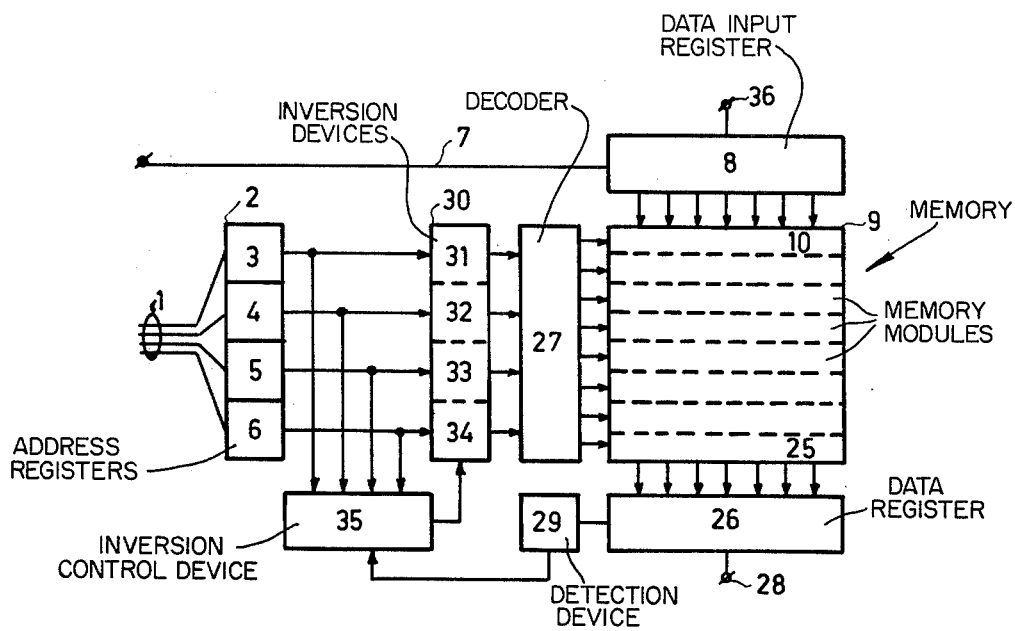
FIG. 3 shows a block diagram of a memory device according to the invention.

The table of FIG. 1 shows the various possibilities for the sequence of sixteen modules according to the invention. The first column states the decimal numbers from 0 15. The second column states the corresponding binary code, the code starting with the most significant bit. This binary code implies that an address bit is inverted if a binary information 0 is present in the position of corresponding significance of the binary code. The code of the last line is 1 1 1 1 (decimal 15), which means that the modules are addressed in the natural sequence 0, 1 ... 15. This is indicated on the associated line. If the module 15 is defective, it can be deactivated without special steps being required, be it that the highest module address is 1 1 1 0 (14). If each module contains a plurality of addresses, the addresses shown in FIG. 1 are the most significant address portions. If the module 14 is defective, in accordance with line 14 only the least significant address bit (at module level) is inverted. Per pair of successive modules, each time a change of place takes place, so that the module 14 is addressed as the last one. When the highest permissible (non-modified) module address is 14 (whereby module 15 is then addressed), the defective module has been put out of operation without further complications. For example, if module 9 is defective, the two central address bits are inverted. Successive foursomes then change place and, moreover, within each foursome successive pairs of modules change place. Module 9 can thus indeed be addressed as the last one. The Figure shows the 16 different possibilities, the address of the defective module indicating the address bits to be inverted: a stored information "0" indicates that the corresponding address bit is inverted. The remaining address space comprises 16 − 1 = 15 modules. The method can also be used for other binary codes (for example, a one-bit-stepping or Gray code).

FIG. 2, comprised of FIGS. 2a and 2b, shows the 120 different possibilities which exist when two of 16 modules are non-usable. For example, when modules 2 and 11 are defective (first column), the second and the third column show the information 0 0 1 1 (decimal 3) and 1 0 1 0 (decimal 10), respectively. By inverting either the first and the second or the second and the fourth address bit, the defective modules are addressed as the numbers 7 and 14, respectively. The modules 0-6 are thus always successively addressable (actually, in that case the modules of the lines 3 and 10, respectively, of FIG. 1 then present in the first seven positions are addressed). However, when the modules 3 and 10 are defective, the first even modules of the lines 2 and 11 of FIG. 1 can be consecutively addressed. In that case the first, the second and the fourth and only the second address bit, respectively, are inverted. The fourth column of FIG. 2 shows the number of consecutively addressable modules for all 120 cases. This number varies between 7 and 14. In the case of an arbitrary failure of two modules, approximately 60% of the memory device remains available. In the case of only one defective module this percentage (15/16) amounts to approximately 94%. In the case of three defective modules, the available portion of the memory device is at least 7/16, so approximately 44%. This can be readily understood as follows: for each combination of three defective modulates, one half of the modules (for example, the halves 0-7 and 8-15) includes at the most one defective module. By a suitable choice from the lines 0-7 or 8-15 in FIG. 1, this defective module can be addressed exactly as the eighth module in the sequence. The first seven modules are then consecutively addressable. When all three defective modules are included in the same half, the number of consecutively addressable modules is larger: up to maximum 13.

The method can be readily extended to cover more defective memory units. Assume that the modules 0, 2, 8 and 13 are defective. In that case the inversion can be controlled by the information 1 0 0 0 of 1 0 1 0. In both cases five of the modules are still consecutively addressable.

Hereinafter, a simple algorithm will be given for determining the address bits to be inverted. The maximum number of consecutively addressable modules is not always reached, because the aim was for a simple device wherein not all original addresses of defective modules are memorized. When a defective module is detected, the address thereof is stored, the stored address bits "0" controlling an inversion of later address signals. When a second defective module is detected, the address thereof is compared one bit after the other with the already stored address. If, starting from the most significant address bit, the address bits each time correspond, nothing happens as regards the stored information. The most significant address bit which does not correspond is not modified either, but all address bits of lesser significance yet are changed into those of the corresponding address of the module which was most recently found to be defective.

Some examples: first the module 6 becomes defective, and the address 0 1 1 0 is stored, so that this module is assigned the last (non-addressable) position in the sequence. Subsequently, the module 1 becomes defective, and the address 0 0 0 1 is compared with the stored address; the second bit deviates, so that the last two bits 0 1 are added to the stored address which is: 0 1 0 1. Conversely, first 0 0 0 1 is stored, and the last two bits thereof are changed to 1 0. This offers the two possibilities stated in the table of FIG. 2 for the combination 1–6 of defective modules (twentieth line of the table). Eleven consecutively addressable modules then remain, i.e. 16-1-4, the most significant bit of the binary code of the digit "4" corresponding to the most significant non-corresponding address bit.

Furthermore: first module 15 becomes defective and the address 1 1 1 1 is stored. Subsequently the module 0 becomes defective, and the last three bits of the address 0 0 0 0 are added to the stored address to from 1 0 0 0, because the most significant non-corresponding address bit was the first one. The number of consecutively addressable modules is then: 16−1−8=7, the binary code of the digit "8" corresponding to the most significant non-corresponding address bit.

The method can be extended to cover more than two defective modules as follows. Assume that the modules 0 and 4 successively become defective, after which the information 0 1 0 0 has been stored for controlling the inversion. Because the last two bits have been replaced (be it by identical information), 16−1−4=11 modules are then consecutively addressable. If subsequently the module 3 becomes defective (address 0 0 1 1), the address then stored may be replaced by 0 1 1 1, an additional condition then existing in that the 11 modules are no longer consecutively addressable, as appears from FIG. 1, there are then only eight (16−4−4) consecutively addressable modules: the most significant address bit but one has then been different twice between successive addresses. However, it is then permissible to leave the stored address unmodified. It appears from FIG. 1 that in this case the optimum stored address would be: 0 0 0 0 with 11 consecutively addressable modules, but this cannot be realized using the described algorithm (chosen for its simplicity). In accordance with the described algorithm, in the above case the combinations 0–5, 0–6 and 0–7 could also be defective, the address being 0 1 0 0 and there being 11 consecutively addressable modules. If subsequently, for example module 13 (1 1 0 1) becomes defective, the stored address is modified to 0 1 0 1, there then being 7 consecutively addressable modules. If subsequently a module having the address ≤ 7(0 . . .) becomes defective, nothing happens. If a further module having an address ≥ 8 becomes defective (1 . . .), either an error signal can be generated (the capacity can then still amount to at the most 6/16 of the original capacity, and in the most unfavorable case even to only 3/16), or the number of readily and consecutively addressable modules can be kept high by taking suitable steps.

Figure 4:
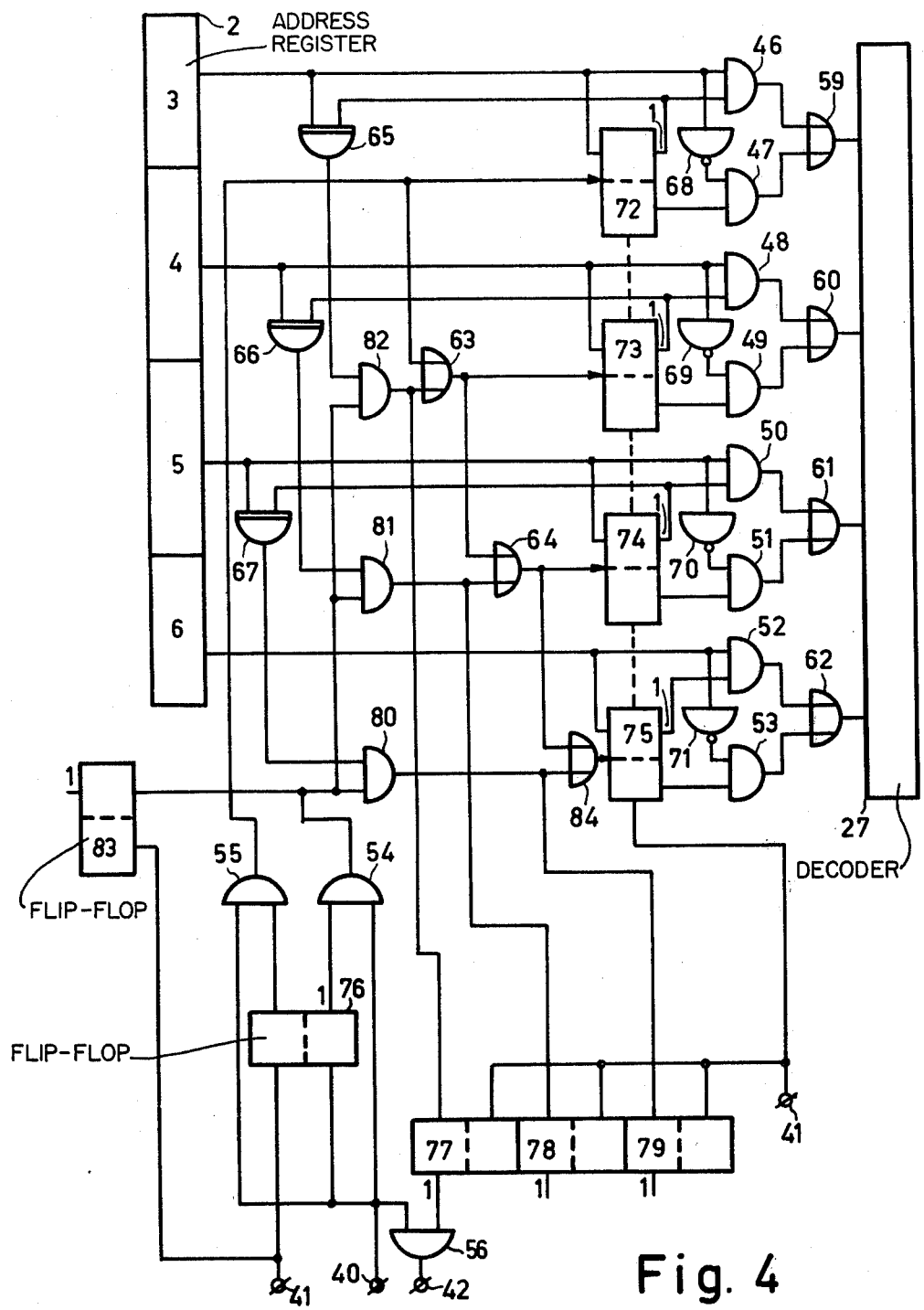
FIG. 4 shows a more detailed circuit according to the invention.

FIG. 3 shows a block diagram of a memory device according to the invention, comprising an input address line 1, an address register 2 having four binary stages 3 . . . 6, a control line for read/write command signals 7, a drive unit annex data input register 8 with a data input line 36, a memory device 9 with modules 10 . . . 25 which are not shown in detail, a decoder 27, a data register 26, a data output line 28, a detection device 29, an inversion device 30 comprising inversion elements 31 . . . 34, and an inversion control device 35. The memory device 9 comprises sixteen storage modules, the contents of which can be output via the data register 26. On the address line 1 a four-bit address arrives which is stored in the address register 2 and which reaches the decoder 27 via the inversion units 31 . . . 34 which have or which have not been activated by the inversion control unit 35. As a result, one of the modules 10-25 is addressable (only 8 address lines are shown for the sake of simplicity). The addressing of, for example, a word in a module is not elaborated; this can possibly be effected for all modules together. Via the line 7 the drive unit 8 is activated, with the result that it is clearly indicated whether a read operation or a write operation is concerned, so that the modules are controlled accordingly. The information to be stored is input, if necessary, via the line 36. The drive information can contain clock pulse information. The Figure illustrates the simple case where the detection device 29 detects whether the information written from the memory into the data register 26 is correct, for example whether it is the correct parity. To this end, the detection device 29 also receives a signal from the drive device 8, for example, for the purpose of synchronization. If an error is detected, the inversion control unit 35 receives a signal whereby the address then still available on the outputs of the address register 2 is stored in the unit; this unit also memorizes "that a defect has occurred". When a module has failed, the information of the entire module is subsequently to be considered unreliable. This affects the operation of the entire memory device: it may be that this error necessitates the fetching of a block of information from a provided background memory to enable continuation of the operation of the computer system including the described memory device. It may also be that a given task which is currently being performed must be started again, but the invention does not relate to these procedures per se. Furthermore, the central control device will have to take suitable steps to adapt the operations to the smaller memory space then available. Under the control of the algorithm which is embodied in the device 35, the inversion units 31 . . . 34 are selectively controlled. The same is applicable to the detection of subsequent defective modules, which is described in more detail with reference to FIG. 4. The line 37 serves, for example, for activating the detection device 29. FIG. 4 shows an elaborated circuit according to the invention, comprising the address register 2 and the decoder 27 shown in FIG. 3. The circuit furthermore comprises two signal input terminals 40, 41, a signal output terminal 42, fourteen logic AND-gates 46 . . . 56, 80 . . . 82, seven logic OR-gates 59 . . . 64, 84, three logic EXCLUSIVE-OR gates 65 . . . 67, four inverters 68 . . . 71, and nine bistable elements 72 . . . 79, 83. Initially, the data flipflops 72 . . . 75 can be in the "1"-position and the set-reset flipflops 76 . . . 79 in the "0"-position. The gates 46, 48, 50, 52 can thus conduct the four address bits which originate from the address register 2 and which reach the decoder 27 via the OR-gates 59 . . . 62. Consequently, the address is not modified. The most significant address bit appears in the register element 3, and the last-significant address bit appears in the element 6. If an error occurs, the potential on the control terminal 40 becomes high for some time. This terminal is connected to an output of the detection device 29 not shown (FIG. 4). The AND-gate 55 then receives two high input signals and actuates the clock pulse inputs of the data flipflops 72 . . . 75 via the OR-gates 63, 64, 84 which operate as a separating element. The address from the address register 2 then valid is then stored in the data flipflops 72 . . . 75, with the result that the address becomes the last of the sequence and cannot be addressed as such. In the case of, for example, the address 0 0 0 0, the "0"-outputs of the flipflops each time become high, with the result that the logic AND-gates 47, 49, 51, 53 can conduct the address bits from the address register 2 which have been inverted by the inverters 68 . . . 71. These signals then reach the decoders 27, again via the OR-gates 59 . . . 62. Thus, see FIG. 1 first line, the address 0 0 0 0 is addressed last. The address 0 0 0 0 can be further blocked in that the signal on the 1-output of the flipflop 76 indicates the control device of the computer system including the memory device according to the invention that the highest permissible address is then 1 1 1 0. It is known to store a highest permissible address separately in computers. The error signal on the terminal 40 becomes low before the "1"-output of the flipflop 76 becomes high. This flipflop 76 may possibly be a flipflop of the master-slave type. As a result, the AND-gates 80 . . . 82 remain blocked for the time being. When a subsequent error occurs, the terminal 40 again receives a high signal, with the result that the AND-gate 54 supplies a high signal and that the gates 56, 80, 81, 82 are unblocked. Furthermore, the output signal of the gate 54 sets the JK-flipflop 83 to the "1"-position, thus indicating that there are two (or more, see hereinafter) defective modules. If none of the three logic EXCLUSIVE-OR gates 65 . . . 67 then supplies a high signal, the module addressed as the fifteenth in the sequence is defective. The address stored in the flipflops 72 . . . 75 then remains unchanged; the high signal on the "1"-output of the flipflop 83 indicates that henceforth at the most 14 successive modules can be consecutively addressed. However, if one of the EXCLUSIVE-OR gates 65, 66, 67 supplies a high signal, a non-corresponding address bit is implied and the following takes place. A high signal of gate 67 reaches, via the AND-gate 80, the flipflop 79 and sets the latter to the "1"-position. The output signal "1" of the flipflop then signals that henceforth at the most thirteen modules can be consecutively addressed. Moreover, the output pulse of the gate 80 sets, via the OR-gate 84, the flipflop 75 to the position corresponding to the value of the least significant address bit in the address register 2. A high signal of gate 66 reaches, via the AND-gate 81 and the OR-gates 64 and 84, the flipflops 74, 75 and 78. The "1"-position of the flipflop 78 then indicates that henceforth only at the most eleven modules can be consecutively addressed. The flipflops 74 and 75 are set to the position corresponding to values of the two least significant address bits in the address register 2. A high signal supplied by the EXCLUSIVE-OR gate 65 indicates that the most significant address bit does not correspond. Via the AND-gate 82, this signal reaches the flipflop 77. The "1"-position of the flipflop 77 then indicates that only seven modules can be consecutively addressed. Moreover, via the OR-gates 63, 64, 84, the flipflops 73, 74, 75 are set to the position corresponding to the values of the three least significant address bits in the address register 2. For the flipflops 72, 73, 74, 75, 77 it is then applicable that the output signal may change only after disappearance of the error signal on terminal 40. To this end, the same steps can be taken as for the flipflop 76.

If a further error occurs, the AND-gate 56 receives two logic signals and an alarm signal appears on the output terminal 42 to indicate that the capacity of the memory device becomes too small. In the described device this occurs only after at least three and at the most six modules have become defective. When the defect has been repaired, the terminal 41 receives a reset pulse, with the result that the flipflops 76, 77, 78, 79, 83 assume the "0"-position. The flipflops 72 . . . 75 can possibly also be reset to the "1"-position by this signal on the reset input 85, but this is not always necessary because the sequence in which the physical modules are addressed is not of eminent importance. Therefore, the reset pulse line is shown as a broken line for these flipflops.

An extension can be realized by way of a multiple construction of the register of the flipflops 72 . . . 75. Like in FIG. 4, the first register then acts to activate the gates 46 . . . 53. The second register is a dummy register which separately memorizes the address of both defective modules when two modules are defective. If a third module then becomes defective, all three addresses are compared with each other, like before, one bit after the other. Corresponding address bits are stored in the active register as such. A majority opinion is formed on the first non-corresponding address bit, and the value corresponding thereto is stored in the corresponding one of the flipflops 72 . . . 75. Of the bits which are less significant (than the first bit), the value then corresponding to the address of the minority is stored. For example: modules 0, 9 and 10 become defective in this order. After the first module has become defective, 0 0 0 0 is stored in the control register, 0 0 0 0 in the first auxiliary register, nothing in the second register, while fifteen modules are consecutively addressable. When the module 9 becomes defective, 0 0 0 1 is stored in the control register, while the second auxiliary register contains 1 0 0 1. When module 10 becomes defective (1 0 1 0), the most significant non-corresponding address bit is the first one. This follows the majority: 1, the next bit follow the "minority" address 0 0 0. Seven modules then remain successively addressable. Majority-forming logic gates are known, and so are the other circuit components to be used.

Figure 5:
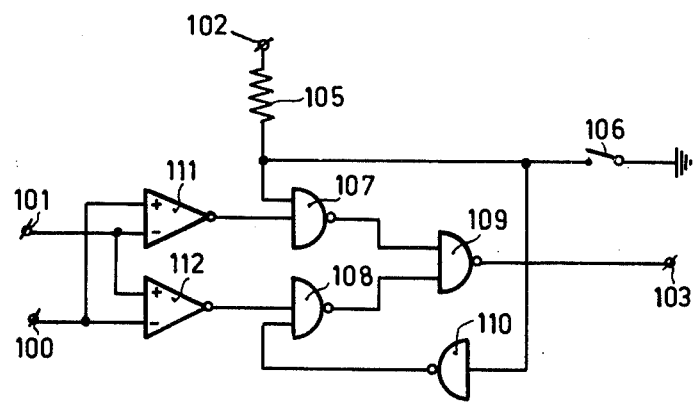
FIG. 5 shows a different embodiment of an inversion element.

FIG. 5 refers to a different embodiment of an inversion element and shows a signal input terminal 100, two voltage input terminals 101, 102, a signal output terminal 103, a resistor 105, a switch 106, four logic NAND-elements 107, 108, 109, 110, and two differential amplifiers 111, 112. A supply voltage of, for example, +5 volts is applied to the terminal 102, and a positive (lower) reference voltage is applied to the terminal 101. When the switch 106 is closed, the upper input of the gate 107 is continuously low, and hence the upper input of the gate element 109 is continuously high, like the lower input of the element 108. When the input signal on the terminal 100 exceeds the reference voltage on the terminal 101, the amplifier 112 supplies a high signal or the element 108 receives two high signals and supplies one low signal. As a result, the element 109 supplies a high signal. If the input voltage is comparatively low, the amplifier 112 also supplies a low signal, with the result that the element 108 supplies a high signal. The element 109 then receives two high signals and supplies one low signal. The non-inverting action is thus implemented. The switch 106 may be manually operatable.

When the switch 106 is open, the upper input of the gate 107 has a high potential due to the resistor 105; this signal is inverted by the element 110, with the result that the lower input of the element 108 is continuously at a low potential, so that the lower input of the gate 109 is continuously at a high potential. If the input signal on the terminal 100 exceeds the reference voltage on the terminal 101, the differential amplifier 111 supplies a low signal, and hence the element 107 supplies a high signal. The element 109 receives two high signals and, therefore, the output signal is low. If the input signal on the terminal 100 is lower than the reference voltage, the amplifier 111 supplies a high signal. The element 107 then receives three high signals and, consequently, supplies a low signal. As a result, the element 109 supplies a high output signal. The inverting action is thus implemented.

As has already been described, a large number of modules can then be consecutively addressable. A switch of this kind is then present for each address bit. The circuit shown in FIG. 4 operates fully automatically, and hence very fast, be it that in some cases the highest possible number of modules does not remain consecutively addressable. In given cases it may be advantageous to restart the procedure automatically, for example, when a given module temporarily exhibits defects, for example, due to an excessively high temperature. When the temperature has dropped, it will function properly again. Meanwhile, a substantial portion of the memory device has remained usable and active.

What is claimed is:
1. A memory comprising:
   a first plurality of memory units, a first input address line connected to said memory units for delivering a first partial address thereto, said first plurality of memory units having valid partial addresses in a first partial address sequence from a specified first to a specified second memory unit;
   a second input address line connected to said memory units for addressing individual bits of one of said memory units;
   a data input register connected to said plurality of memory units;
   a data output register connected to said plurality of memory units;
   a detection device connected to said data output register for detecting a non correctable storage error and producing an output signal;
   an inversion device connected to said first input address line for inverting predetermined address bits, thereby allowing addressing of said first plurality of memory units in a second partial address sequence starting from a third memory unit;
   an inversion control device, having an input connected to said detection device, and an output connected to said inversion device for activating said inversion device; and
   blocking means for blocking addressing of ones of a second plurality of memory units beyond a predetermined fourth memory unit, said blocking means and said inversion control device being linked for blocking addressing of a faulty memory unit in said second plurality of memory units.

2. The device defined in claim 1, wherein said inversion device comprises:
   a signal input terminal;
   two differential amplifiers each having an input connected to said input terminal, and an output; and
   logic means connected to said outputs of said differential amplifiers for controllably inverting the signal supplied on said input terminal.

* * * * *

UNITED STATES PATENT AND TRADEMARK OFFICE
CERTIFICATE OF CORRECTION

PATENT NO. : 4,028,539
DATED : June 7, 1977
INVENTOR(S) : PIETER ANTON JACOBS

It is certified that error appears in the above-identified patent and that said Letters Patent are hereby corrected as shown below:

On the Title page, section [57], line 5, "detective" should be --defective--

Column 1, line 10, "commmand" should be --command--
        line 50, "noncorrectable" should be --non-correctable--

Column 2, line 34, "ory)" should be --ory unit)--
        line 55, "for-" should be --infor- --

Column 3, line 41, "0 15" should be --0 to 15--
        line 44, "0" should be --"O"--

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*